(12) United States Patent
Yu

(10) Patent No.: US 6,246,103 B1
(45) Date of Patent: Jun. 12, 2001

(54) BIPOLAR JUNCTION TRANSISTOR WITH TUNNELING CURRENT THROUGH THE GATE OF A FIELD EFFECT TRANSISTOR AS BASE CURRENT

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/427,136

(22) Filed: Oct. 25, 1999

(51) Int. Cl.[7] .............................. H01L 29/00; H01L 27/82

(52) U.S. Cl. ........................................... 257/557; 257/592

(58) Field of Search .................................. 257/328, 557, 257/558, 592

Primary Examiner—Steven Loke
(74) Attorney, Agent, or Firm—Monica H. Choi

(57) ABSTRACT

A MOSBJT (Metal Oxide Semiconductor Bipolar Junction Transistor) is formed to have both the higher current drive capability of the BJT and the smaller device area of the scaled down MOSFET. The MOSBJT includes a collector region and an emitter region comprised of a semiconductor material with a first type of dopant. A base region is disposed between the collector region and the emitter region, and the base region is comprised of a semiconductor material with a second type of dopant that is opposite of the first type of dopant. Unlike a conventional BJT, a base terminal of the MOSBJT is comprised of a dielectric structure disposed over the base region and comprised of a gate structure disposed over the dielectric structure. Unlike a conventional MOSFET, the dielectric structure of the MOSBJT is relatively thin such that a tunneling current through the dielectric structure results when a turn-on voltage is applied on the gate structure. This tunneling current is a base current of the MOSBJT. Furthermore, unlike a conventional MOSFET, the dielectric structure and the gate structure of the MOSBJT are not disposed over the collector region and the emitter region to prevent tunneling current between the gate structure and the collector and emitter regions.

9 Claims, 3 Drawing Sheets ically, the conventional BJT 200 occupies a rela-
BIPOLAR JUNCTION TRANSISTOR WITH TUNNELING CURRENT THROUGH THE GATE OF A FIELD EFFECT TRANSISTOR AS BASE CURRENT

TECHNICAL FIELD

The present invention relates generally to integrated circuit devices, and more particularly, to a bipolar junction transistor formed with a scaled down field effect transistor by using the tunneling current through the gate of the field effect transistor having a thin gate dielectric as the base current of the bipolar junction transistor.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The conventional MOSFET 100 includes a drain 104, a source 106, and a gate structure 108 disposed over a gate dielectric 110, as known to one of ordinary skill in the art of integrated circuits.

A limitation to further scaling down the dimensions of the MOSFET 100 is scaling down the thickness of the gate dielectric 110. When the thickness of the gate dielectric 110 is scaled down to below approximately 15 Å (angstroms), charge carriers tunnel through such a thin gate dielectric 110 to form undesired tunneling current through the gate 108. With such tunneling current, the gate 108 of the MOSFET 100 becomes less capacitive and more resistive, and the MOSFET 100 has lower current drive capability because less charge is induced in the channel region of the MOSFET 100 below the gate dielectric 110. Such lowered current drive capability degrades the speed performance of the MOSFET 100.

Referring to FIG. 2, another common component of a monolithic IC is a BJT (Bipolar Junction Transistor) 200. The conventional BJT 200 includes an emitter region 122 and a collector region 124 that are comprised of a semiconductor material having a first type of dopant, as known to one of ordinary skill in the art of integrated circuits. The conventional BJT also includes a base region 126 that is comprised of a semiconductor material having a second type of dopant that is opposite of the first type of dopant, as known to one of ordinary skill in the art of integrated circuits.

For example, for an NPN BJT, the emitter region 122 and the collector region 124 may be comprised of silicon with an N-type dopant while the base region 126 may be comprised of silicon with a P-type dopant. Alternatively, for a PNP BJT, the emitter region 122 and the collector region 124 may be comprised of silicon with a P-type dopant while the base region 126 may be comprised of silicon with an N-type dopant.

The BJT 200 has larger current drive capability than the MOSFET 100 since the transconductance of a BJT is directly proportional to the current through the collector 124 of the BJT whereas the transconductance of a MOSFET is directly proportional to the square root of the current through the drain 104 of the MOSFET, as known to one of ordinary skill in the art of integrated circuits. However, unfortunately, the conventional BJT 200 occupies a relatively large area within an integrated circuit.

Because of the degradation of the current drive capability of a conventional MOSFET as the MOSFET is further scaled down and because of the large area occupied by a conventional BJT, another type of transistor is desired which has the desirable characteristics of both the higher current drive capability of the BJT and the smaller device area of the scaled down MOSFET.

SUMMARY OF THE INVENTION

Accordingly, in a general aspect of the present invention, a MOSBJT (Metal Oxide Semiconductor Bipolar Junction Transistor) is formed to have both the higher current drive capability of the BJT and the smaller device area of the scaled down MOSFET.

In one embodiment of the present invention, the MOSBJT is formed to include a collector region and an emitter region comprised of a semiconductor material with a first type of dopant. A base region is disposed between the collector region and the emitter region, and the base region is comprised of a semiconductor material with a second type of dopant that is opposite of the first type of dopant. In addition, unlike a conventional BJT, a base terminal is comprised of a dielectric structure disposed over the base region and comprised of a gate structure disposed over the dielectric structure. Unlike a conventional MOSFET, the dielectric structure is relatively thin such that a tunneling current through the dielectric structure of the MOSBJT results when a turn-on voltage is applied on the gate structure. The tunneling current is the base current of the MOSBJT. Furthermore, unlike a conventional MOSFET, the dielectric structure and the gate structure are not disposed over the collector region and the emitter region to prevent tunneling current between the gate structure and the collector and emitter regions.

In this manner, the MOSBJT has current characteristics of a bipolar junction transistor device with the tunneling current through the thin gate dielectric being the base current. Thus, the MOSBJT has the larger current drive capability of a bipolar junction transistor. Furthermore, the collector region, the base region, the emitter region, and the gate structure of the MOSBJT are formed within an active device area that typically contains a MOSFET. The MOSBJT is formed by modification of components of a MOSFET with scaled down dimensions such that the MOSBJT occupies the device area of a MOSFET with scaled down dimensions.

In another aspect of the present invention, a buffer region is formed between the collector region and the base region, for preventing base-to-collector junction breakdown and for preventing punch-through effect between the collector region and the emitter region in the MOSBJT.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, and 9 refer to elements having similar structure and function.

DETAILED DESCRIPTION

Figure 1:
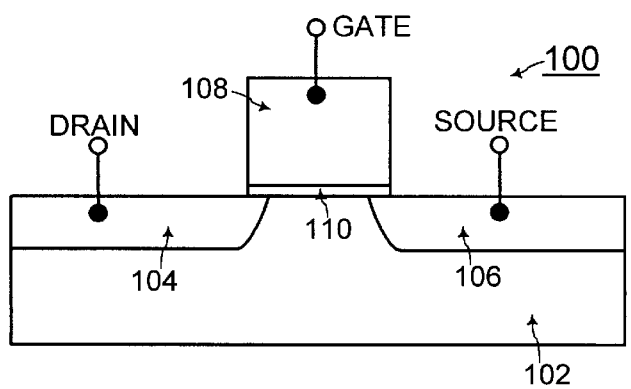
FIG. 1 shows a cross-sectional view of a conventional MOSFET (Metal Oxide Semiconductor Field Effect Transistor) of the prior art.
Figure 2:
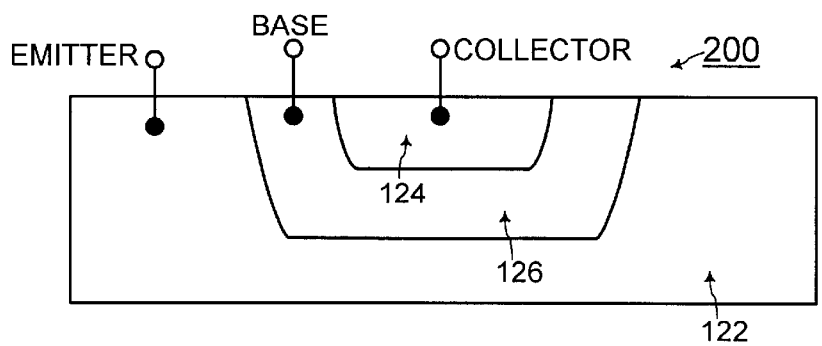
FIG. 2 shows a cross-sectional view of a conventional BJT (Bipolar Junction Transistor) of the prior art.
Figure 3:
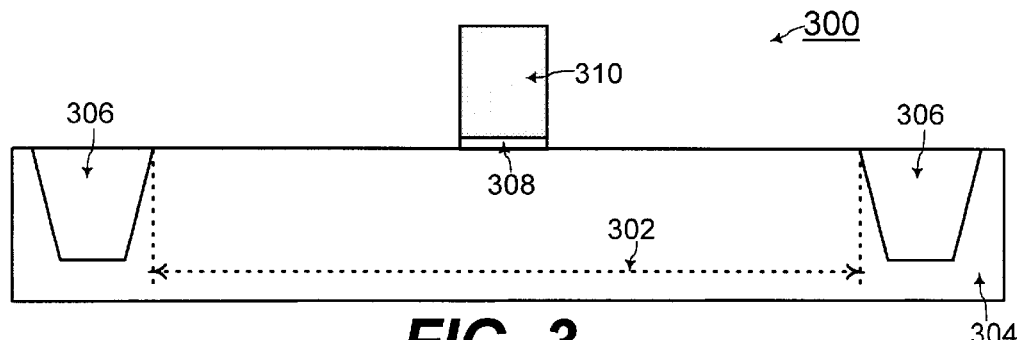
FIGS. 3, 4, 5, 6, 7, and 8 show cross-sectional views of a MOSBJT (Metal Oxide Semiconductor Bipolar Junction Transistor) fabricated according to the present invention for providing the current drive capability of a bipolar junction transistor while at the same time occupying the smaller device area of a scaled down MOSFET.

Referring to FIG. 3, in a general aspect of the present invention, a MOSBJT (Metal Oxide Semiconductor Bipolar Junction Transistor) 300 of the present invention is fabricated to provide the current drive capability of a bipolar junction transistor while at the same time occupying the smaller device area of a scaled down MOSFET. The MOSBJT 300 is fabricated within an active device area 302 of a semiconductor substrate 304 enclosed by isolation structures 306. The isolation structures 306 may be shallow trench isolation structures as illustrated in FIG. 3, and processes for formation of such isolation structures 306 are known to one of ordinary skill in the art of integrated circuit fabrication. Typically, a MOSFET (Metal Oxide Semiconductor Field Effect Transistor) is fabricated within the active device area 302. However, components of the conventional MOSFET are modified to form the MOSBJT 300 of the present invention.

For fabrication of the MOSBJT 300 of an embodiment of the present invention, a dielectric structure 308 is formed on a portion of the active device area 302 as illustrated in FIG. 3. A gate structure 310 is formed over the dielectric structure 308. The dielectric structure 308 and the gate structure 310 are common components of the conventional MOSFET, and processes for formation of the dielectric structure 308 and the gate structure 310 are known to one of ordinary skill in the art of integrated circuit fabrication. When the semiconductor substrate 304 is comprised of silicon, the dielectric structure 308 may be comprised of silicon dioxide ($SiO_2$) for example, and the gate structure 310 may be comprised of polysilicon having a thickness in a range of approximately 1000 Å (angstroms) to approximately 2000 Å (angstroms) for example.

Figure 4:
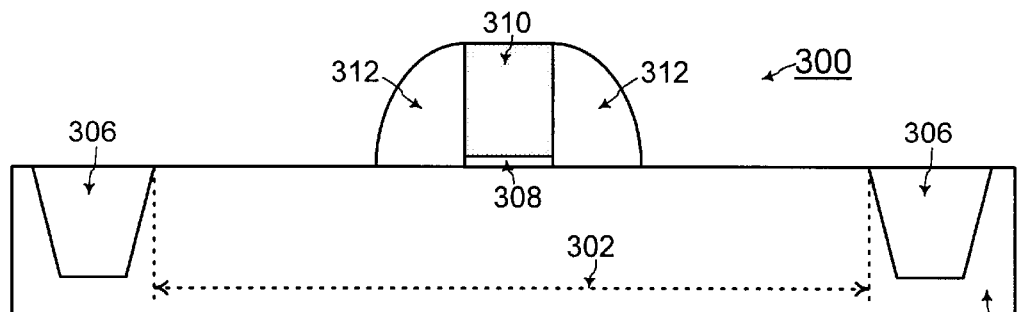

Referring to FIG. 4, a spacer 312 is formed on the sidewalls of the dielectric structure 308 and the gate structure 310. The spacer 312 may be comprised of silicon dioxide ($SiO_2$) or silicon nitride (SiN), and processes for formation of such a spacer are known to one of ordinary skill in the art of integrated circuit fabrication.

Figure 5:
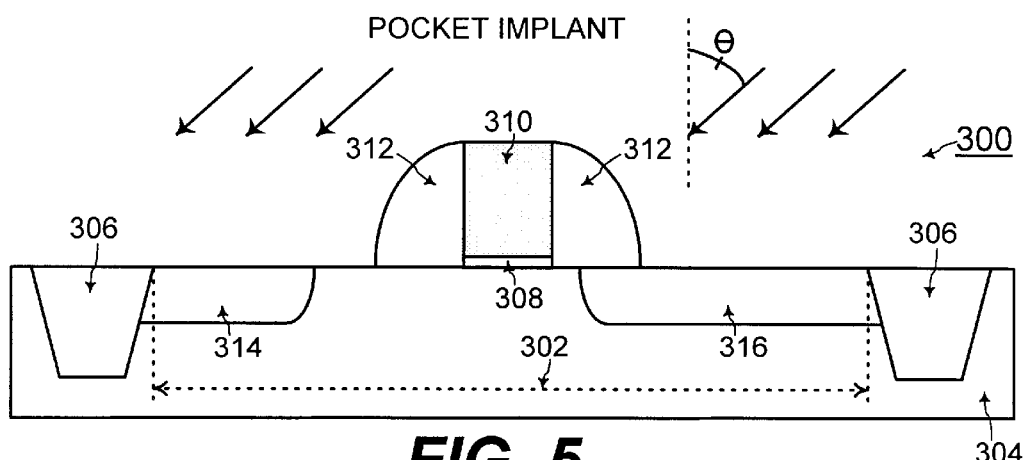

Referring to FIG. 5, after formation of the spacer 312, a pocket dopant is implanted into the exposed portions of the active device area 302 of the semiconductor substrate 304 using a large-angle-tilt implant. Such an implantation process forms a first initial pocket region 314 and a second initial pocket region 316. The first initial pocket region 314 is located at the left side of the gate structure 310 where an emitter region is to be formed for the MOSBJT 300 of the present invention. The second initial pocket region 316 is located at the right side of the gate structure 310 where a collector region is to be formed for the MOSBJT 300 of the present invention.

In the large-angle-tilt implantation, the pocket dopant is directed from the collector region at the right of the gate structure 310 toward the gate structure 310 as illustrated in FIG. 5. The angle of implantation θ with respect to an axis that is perpendicular to the semiconductor substrate is in a range of approximately 40° to 60°. Because of the shadowing effect of the gate structure 310 and the spacer 312, the first initial pocket region 314 does not extend under the spacer 312 at the left of the gate structure 310, whereas the second initial pocket region 316 does extend under the spacer 312 at the right of the gate structure 310, as illustrated in FIG. 5.

Figure 6:
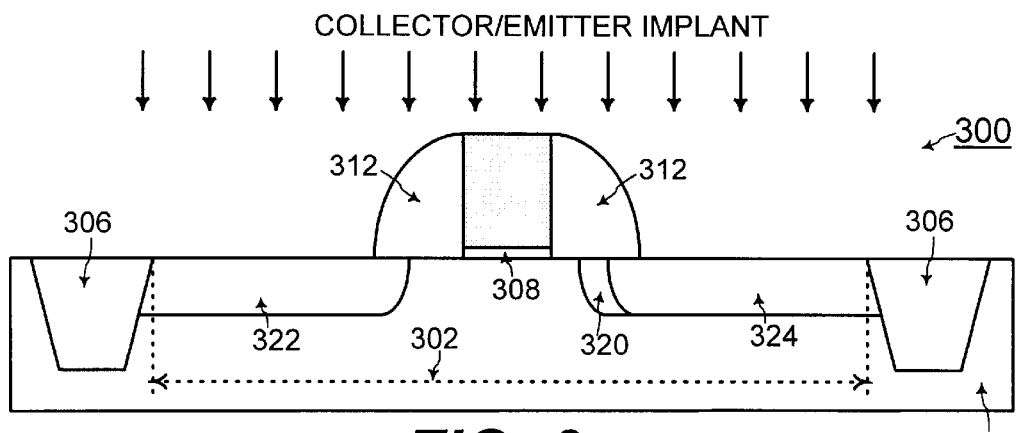

Referring to FIG. 6, implantation of a collector and emitter dopant into exposed portions of the active device area 302 of the semiconductor substrate 304 forms an emitter region 322 at the left of the gate structure 310 and a collector region 324 at the right of the gate structure 310. The collector and emitter dopant within the emitter region 322 and the collector region 324 is then activated, using a RTA (Rapid Thermal Anneal) process for example as known to one of ordinary skill in the art of integrated circuit fabrication. The collector and emitter dopant is also implanted and activated concurrently within the gate structure 310 for enhancing the conductivity of the gate structure 310.

Referring to FIGS. 5 and 6, the pocket dopant is an opposite type of dopant from the collector and emitter dopant. Thus, after implantation and activation of the collector and emitter dopant, the first initial pocket 314 and a portion of the second initial pocket 316 that are exposed to the implantation and activation of the collector and the emitter dopant disappear. A buffer region 320 remains which is substantially under the spacer 312 such that the buffer region 320 is not exposed to the implantation and activation of the collector and the emitter dopant.

The collector and emitter dopant is a first type of dopant that is opposite to a second type of dopant of the semiconductor substrate 304. Thus, the semiconductor substrate 304 between the emitter region 322 and the collector region 324 forms a base region of the MOSBJT 300. For example, for an NPN BJT, the semiconductor substrate 304 may be silicon with a P-type dopant. In that case, the collector and emitter dopant is an N-type dopant. Alternatively, for a PNP BJT, the semiconductor substrate 304 may be silicon with an N-type dopant. In that case, the collector and emitter dopant is a P-type dopant.

In this manner, the emitter region 322 forms the emitter of the MOSBJT 300 of an embodiment the present invention, and the collector region 324 forms the collector of the MOSBJT 300 of an embodiment the present invention. The base of the MOSBJT 300 of an embodiment of the present invention is formed by the semiconductor material of the semiconductor substrate 304 between the emitter region 322 and the collector region 324.

The base terminal of the MOSBJT 300 is formed by the dielectric structure 308 and the gate structure 310. The dielectric structure 308 is relatively thin such that a tunneling current flows through the dielectric structure 308 when a turn-on voltage is applied on the gate structure 310. For example, when the dielectric structure 308 is comprised of silicon dioxide ($SiO_2$), then the dielectric structure may have a thickness in a range of approximately 8 Å (angstroms) to approximately 12 Å (angstroms). The tunneling current through the dielectric structure 308 forms the base current of the MOSBJT 300 of the present invention.

Referring to FIG. 6, in an embodiment of the present invention, the spacer 312 blocks the implantation of the collector and emitter dopant such that the dielectric structure 308 and the gate structure 310 are not disposed over the emitter region 322 and the collector region 324. Without the overlap of the dielectric structure 308 and the gate structure 310 over the emitter region 322 and the collector region 324, the tunneling leakage current through the dielectric structure 308 from the gate structure 310 to the emitter region 322 and to the collector region 324 is minimized.

Additionally referring to FIG. 6, the buffer region 320 is formed between the collector region 324 and the base region formed by the semiconductor between the emitter region 322 and the collector region 324. The buffer region 320 is doped with the pocket dopant which is opposite in type to the collector and emitter dopant of the collector region 324. For example, for an NPN BJT, the collector region 324 is doped with an N-type dopant. In that case, the buffer region 320 is doped with a P-type dopant in the large-angle-tilt implantation of FIG. 5. Alternatively, for a PNP BJT, the collector region 324 is doped with a P-type dopant. In that case, the buffer region 320 is doped with an N-type dopant in the large-angle-tilt implantation of FIG. 5.

With such formation of the buffer region 320 between the base region and the collector region 324 of the MOSBJT 300, the electric field between the base region and the collector region 324 is minimized to prevent base-to-collector junction breakdown and to prevent punch-through effect between the emitter region 322 and the collector region 324. The base-to-collector junction breakdown is likely to result when a relatively large bias voltage is applied between the base region and the collector region 324, as known to one of ordinary skill in the art of integrated circuit fabrication. The buffer region 320 minimizes such base-to-collector junction breakdown.

The buffer region 320 is formed asymmetrically only on the side of the collector region 320 in one embodiment of the present invention of FIG. 6. During normal operation of the MOSBJT 300, the base-to-emitter junction is likely to be biased at the conventional BJT turn-on voltage of approximately 0.7V, as known to one of ordinary skill in the art of integrated circuits. At such a low voltage bias, the base-to-emitter junction is not likely to break down. However, the base-to-collector junction may be subject to a higher voltage bias. The buffer region 320 disposed between the base region and the collector region 324 minimizes the base-to-collector junction breakdown from such a higher voltage bias.

Punch-through effect is likely to result as the channel length of the MOSFET devices is further scaled down such that the emitter region 322 and the collector region 324 are disposed closer to each other, as known to one of ordinary skill in the art of integrated circuit fabrication. The buffer region 320 minimizes such punch-through effect between the emitter region 322 and the collector region 324.

Figure 7:
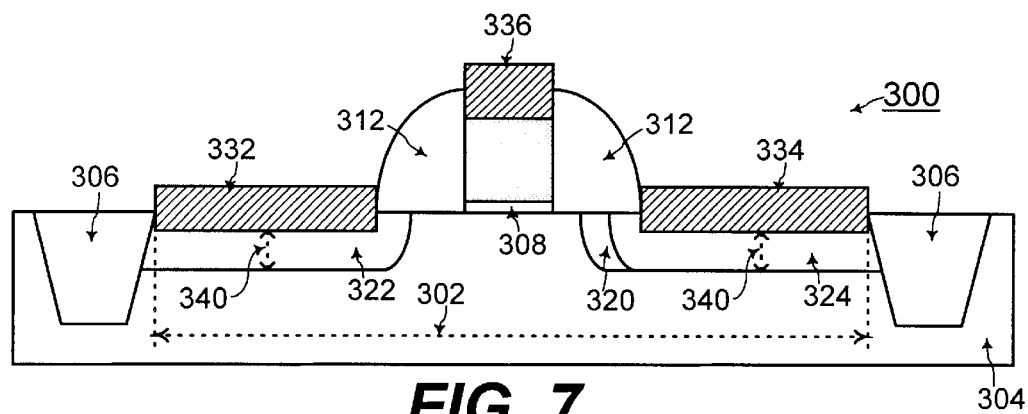

Referring to FIG. 7, an emitter silicide 332 is formed on the emitter region 322 for providing contact to the emitter of the MOSBJT 300. Similarly, a collector silicide 334 is formed on the collector region 324 for providing contact to the collector of the MOSBJT 300. Likewise, a base silicide 336 is formed on the gate structure 310 for providing contact to the base of the MOSBJT 300. Such silicides may be comprised of one of cobalt silicide ($CoSi_2$) or titanium silicide ($TiSi_2$) for example, and processes for formation of such silicides are known to one of ordinary skill in the art of integrated circuit fabrication.

Referring to FIG. 7, in a preferred embodiment of the present invention, a distance 340 between the bottom of the emitter silicide 332 and the depth of the emitter region 322 or between the bottom of the collector silicide 334 and the depth of the collector region 324 is large enough (greater than approximately 500 Å (angstroms) for example) to avoid overrun of the emitter silicide 332 and the collector silicide 334 into the depletion region formed between the base-to-emitter junction and the base-to-collector junction, respectively, of the MOSBJT 300.

Figure 8:
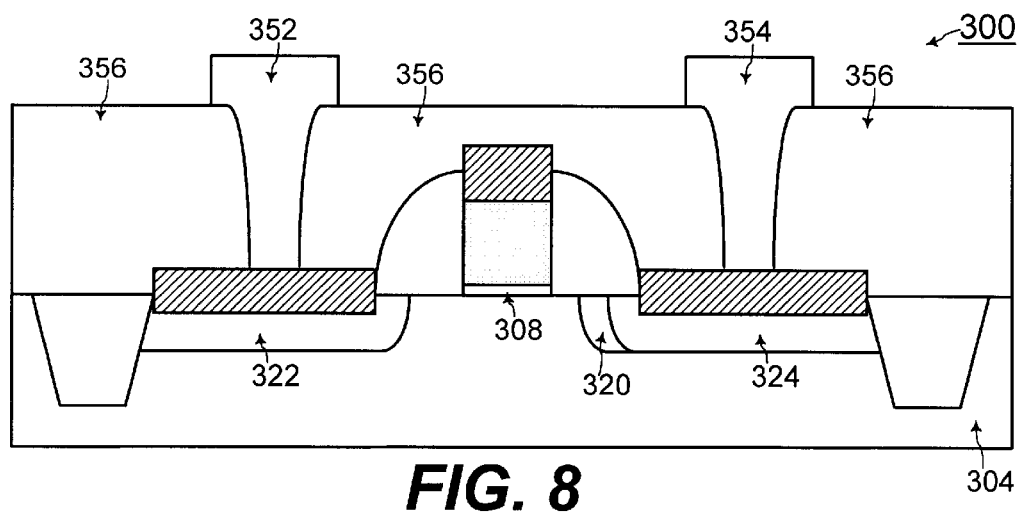

Referring to FIG. 8, conventional fabrication processes may follow for forming contacts and interconnects to the MOSBJT 300 such as an emitter contact 352 to provide connection to the emitter silicide 332 and a collector contact 354 to provide connection to the collector silicide 334. Field oxides 356 may also be deposited for electrical isolation of the components of the MOSBJT 300.

In this manner, by modifying the components of a conventional MOSFET device, a bipolar junction transistor is formed that occupies the active device area normally having a MOSFET fabricated therein. Thus, the MOSBJT 300 of the present invention is fabricated laterally within the active device area 302 of the semiconductor substrate 304 and occupies the small device area of a scaled down MOSFET. In addition, the tunneling current through the scaled down thin gate dielectric is the base current of a bipolar junction transistor such that the MOSBJT 300 has the higher current drive capability of a bipolar junction transistor. The MOSBJT 300 may advantageously be used as the bipolar junction transistor device in BiCMOS integrated circuits requiring characteristics of both MOSFETs and BJTs.

Figure 9:
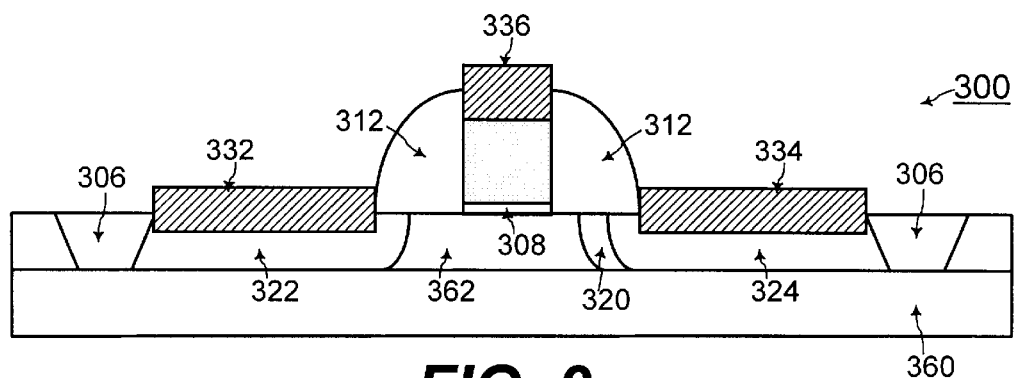
FIG. 9 shows the cross-sectional view of the MOSBJT (Metal Oxide Semiconductor Bipolar Junction Transistor) fabricated according to another embodiment of the present invention on an insulator structure for forming a SOI (Semiconductor On Insulator) structure.

In addition, referring to FIG. 9, the MOSBJT 300 may advantageously be laterally fabricated on an insulator structure 360 for forming an SOI (semiconductor on Insulator) structure. SOI technology is known to one of ordinary skill in the art of integrated circuit fabrication. In that case, a base region 362 is formed on the insulator structure 360 between the emitter region 322 and the collector region 324. Referring to FIGS. 8 and 9, with the SOI structure of FIG. 9, the emitter current at the bottom of the emitter region 322 to the semiconductor substrate 304 of FIG. 8 is eliminated such that the charge emitted from the emitter region 322 travels substantially laterally toward the collector region 324 to increase the efficiency of the MOSBJT 300 as a bipolar junction transistor.

The foregoing is by way of example only and is not intended to be limiting. For example, any specified thickness of any structure and any example material comprising any structure described herein are by way of example only. Furthermore, as will be understood by those skilled in the art, the structures described herein may be made or used in the same way regardless of their position and orientation. Accordingly, it is to be understood that terms and phrases such as "over," "sidewall," "left," and "right" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A Metal Oxide Semiconductor Bipolar Junction Transistor comprising:

a collector region comprised of a semiconductor material with a first type of dopant;

an emitter region comprised of a semiconductor material with said first type of dopant;

a base region disposed between said collector region and said emitter region, said base region being comprised of a semiconductor material with a second type of dopant that is opposite of said first type of dopant; and a base terminal comprised of a dielectric structure disposed over said base region and comprised of a gate structure disposed over said dielectric structure;

wherein said dielectric structure is relatively thin such that a tunneling current through said dielectric structure results when a turn-on voltage is applied on said gate structure;

and wherein said tunneling current is a base current of said Metal Oxide Semiconductor Bipolar Junction Transistor;

and wherein said dielectric structure and said gate structure are not disposed over said collector region and said emitter region to prevent tunneling current between said gate structure and said collector and emitter regions.

2. The Metal Oxide Semiconductor Bipolar Junction Transistor of claim 1, further including a buffer region, disposed between said collector region and said base region, for preventing base-to-collector junction breakdown and for preventing punch-through effect between said collector region and said emitter region.

3. The Metal Oxide Semiconductor Bipolar Junction Transistor of claim 1, wherein said collector region, said emitter region, and said base region are fabricated laterally within a semiconductor substrate.

4. The Metal Oxide Semiconductor Bipolar Junction Transistor of claim 1, wherein said collector region, said emitter region, and said base region are fabricated laterally on an insulator structure to form a structure.

5. The Metal Oxide Semiconductor Bipolar Junction Transistor of claim 1, wherein said dielectric structure is comprised of silicon dioxide ($SiO_2$) having a thickness in a range of approximately 8 Å to approximately 12 Å.

6. The Metal Oxide Semiconductor Bipolar Junction Transistor of claim 5, wherein said base region is comprised of doped silicon, and wherein said gate structure is comprised of polysilicon having a thickness in a range of approximately 1000 Å to approximately 2000 Å.

7. The Metal Oxide Semiconductor Bipolar Junction Transistor of claim 1, further comprising:

a spacer disposed on sidewalls of said gate structure, said spacer being comprised of one of silicon dioxide and silicon nitride.

8. The Metal Oxide Semiconductor Bipolar Junction Transistor of claim 1, wherein said collector region and said emitter region are comprised of silicon with an N-type dopant and wherein said base region is comprised of silicon with a P-type dopant for formation of an NPN Bipolar Junction Transistor.

9. The Metal Oxide Semiconductor Bipolar Junction Transistor of claim 1, wherein said collector region and said emitter region are comprised of silicon with a P-type dopant and wherein said base region is comprised of silicon with an N-type dopant for formation of a PNP Bipolar Junction Transistor.

* * * * *